United States Patent
Brandner et al.

(10) Patent No.: US 9,379,560 B2
(45) Date of Patent: Jun. 28, 2016

(54) METHOD AND DEVICE TO MONITOR THE CURRENT OF A BATTERY-OPERATED HANDHELD POWER TOOL

(75) Inventors: Michael Brandner, Buchloe (DE); Thomas Mueller, Klosterlechfeld (DE); Bernd Ziegler, Hiltenfingen (DE)

(73) Assignee: Hilti Aktiengesellschaft, Schaan (LI)

( * ) Notice: Subject to any disclaimer, the term of this patent is extended or adjusted under 35 U.S.C. 154(b) by 177 days.

(21) Appl. No.: 14/241,752

(22) PCT Filed: Jun. 20, 2012

(86) PCT No.: PCT/EP2012/061766
§ 371 (c)(1),
(2), (4) Date: Apr. 18, 2014

(87) PCT Pub. No.: WO2013/029825
PCT Pub. Date: Mar. 7, 2013

(65) Prior Publication Data
US 2014/0232352 A1  Aug. 21, 2014

(30) Foreign Application Priority Data
Aug. 30, 2011   (DE) .......................... 10 2011 081 790

(51) Int. Cl.
*H02J 7/00* (2006.01)
*B25F 5/00* (2006.01)
(Continued)

(52) U.S. Cl.
CPC ................ *H02J 7/0031* (2013.01); *B25F 5/00* (2013.01); *G01R 19/0092* (2013.01);
(Continued)

(58) Field of Classification Search
CPC ..... H02J 7/0045; H02J 7/0031; H02J 7/0013; H02J 7/0004; H02J 7/0021; H02J 7/041; H02J 7/0091; H02J 2007/004; H02J 2007/005; H02J 2007/0098; H02J 7/0006; H02J 7/0014; H02J 7/0019; H02J 7/0022
USPC .................................................. 320/126–136
See application file for complete search history.

(56) References Cited

U.S. PATENT DOCUMENTS

| 6,087,815 | A | 7/2000 | Pfeifer et al. |
| 2004/0232892 | A1 | 11/2004 | Aradachi et al. |
| 2004/0263119 | A1* | 12/2004 | Meyer .................. H02J 7/0004 320/116 |
| 2005/0077878 | A1 | 4/2005 | Carrier et al. |
| 2006/0071634 | A1* | 4/2006 | Meyer .................... H02J 7/041 320/112 |

(Continued)

FOREIGN PATENT DOCUMENTS

| CN | 100541971 | 2/2005 |
| CN | 201248022 | 5/2009 |

(Continued)

*Primary Examiner* — Binh Tat
(74) *Attorney, Agent, or Firm* — Davidson, Davidson & Kappel, LLC (57) ABSTRACT

A method to monitor the current of a handheld power tool (3) operated by a battery (2), by at least one counter (5), includes the following steps:
  measuring (S1) the electric current (I) drawn from the battery during the operation of the electric tool;
  incrementing (S2) a reading (Z, Z1, Z2) of the counter (5) by a certain increment (IN) whenever the measured current (I) is higher than a specified upper limit value (G1, G2) during a given counting interval;
  decrementing (S3) the reading of the counter by a certain decrement (DE) whenever the measured current is lower than the specified upper limit value during the given counting interval; and
  switching off (S4) the electric tool when the reading (Z, Z1, Z2) of the counter is higher than a specified limit value (T1, T2) for the counter.

15 Claims, 7 Drawing Sheets

(51) Int. Cl.
  *H01M 10/42* (2006.01)
  *H01M 10/48* (2006.01)
  *G01R 19/00* (2006.01)
  *G01R 31/36* (2006.01)
  *H02H 7/08* (2006.01)
(52) U.S. Cl.
  CPC ............. *H01M 10/42* (2013.01); *H01M 10/48* (2013.01); *G01R 31/3606* (2013.01); *H02H 7/0811* (2013.01); *H02J 7/0078* (2013.01); *H02J 2007/0039* (2013.01); *H02J 2007/0067* (2013.01)

(56) References Cited

U.S. PATENT DOCUMENTS

2010/0176766 A1    7/2010  Brandner et al.
2013/0200853 A1*   8/2013  Ro .................. H02J 7/0026
                                                320/134

FOREIGN PATENT DOCUMENTS

| | | |
|---|---|---|
| CN | 201349196 | 11/2009 |
| DE | 102009000102 | 7/2010 |
| DE | 102010027406 | 1/2011 |

* cited by examiner

METHOD AND DEVICE TO MONITOR THE CURRENT OF A BATTERY-OPERATED HANDHELD POWER TOOL

This is a national phase application of International Patent Application PCT/EP2012/061766, filed Jun. 20, 2012, claiming the benefits of German Application DE 10 2011 081 790.5, filed Aug. 30, 2011 and hereby incorporated by reference herein.

The present invention relates to a method and to a device to monitor the current of a battery-operated handheld power tool. The electric tool is, for example, an electric screwdriver or a battery-operated handheld circular saw.

BACKGROUND

Rechargeable batteries, secondary batteries or accumulators are employed as batteries in handheld power tools. In particular, the battery has several rechargeable battery cells, for example, lithium-ion accumulator cells. For purposes of prolonging the service life, it is common practice to employ exhaustive-discharge protection, excess-temperature protection and excess-current protection, for instance, in case the tool is overloaded or blocked.

Conventional overload protection or excess-current protection monitors the current drawn from the battery to check whether a defined or pre-specified limit has been exceeded over a given period of time, in which case the tool is switched off. This pre-specified limit is normally far above the normal or average operating current of the electric tool. If the user of the electric tool releases the switch after an actuation or switch-off procedure and then presses the switch again, the tool can once again be operated for the defined period of time.

Particularly with lithium-ion accumulator cells, however, it is not only the case that brief high currents have a detrimental effect on the service life, but it is also the case that relatively low currents during prolonged discharging cycles can already markedly decrease the service life of the lithium-ion accumulator cells. However, conventional current monitoring is not conducive to the envisaged goal here since after a brief interruption, especially by releasing and once again pressing the switch of the tool, the user can already once again operate the tool for a relatively long period of time in the high current ranges of, for instance, 70 A to 100 A.

SUMMARY OF THE INVENTION

The present invention provides a method for monitoring the current of a battery-operated electric tool by means of at least one counter comprising the following steps: measuring the electric current drawn from the battery during the operation of the electric tool, incrementing the reading of the counter by a certain increment whenever the measured current is higher than a specified upper limit value during a given counting interval, decrementing the reading of the counter by a certain decrement whenever the measured current is lower than the specified upper limit value during the given counting interval, and switching off the electric tool when the reading of the counter is higher than a specified limit value for the counter.

The reading of the counter can be monitored during the operation of the electric tool as well as during a defined self-holding time after the switch has been released, whereby the contact-breaking means switches off the tool when the defined limit, namely, the specified limit value for the counter, has been reached. The current monitoring according to the invention improves the protection of the battery and prolongs its service life. Moreover, the power of the electric tool is enhanced due to the improvement of the service life and of the output of the battery. For instance, if the tool is once again operated at a higher current immediately after having been switched off, this is only possible according to the invention for a very short period of time due to the reading of the counter which is then still high. Only after a commensurately long pause during which the counter is once again decremented is the entire time span again available for operating the electric tool above the upper limit value. However, as long as the reading of the counter has not reached zero, the entire time span is not available for operating the electric tool above the specified upper limit. For example, the current monitoring according to the invention prevents the user from operating the tool for a prolonged period of time at high, especially excessively high, current ranges of 70 A to 100 A, already after a brief interruption, for instance, if the switch is released and then pressed once again.

In one embodiment, several counters are provided. A certain increment, a certain decrement, a certain counting interval, a certain upper limit value and a certain limit value for the counter are associated with the appertaining counter.

For instance, two counters can be provided, whereby a lower upper limit value and, in exchange, a higher limit value for the counter are associated with a first counter, and whereby a higher upper limit value and, in exchange, a lower specified limit value for the counter are associated with a second counter.

In another embodiment, the following steps are carried out for each counter of the plurality of counters: incrementing the reading of the counter by a certain increment whenever the measured current is higher than a specified upper limit value during a given counting interval, decrementing the reading of the counter by a certain decrement whenever the measured current is lower than a specified upper limit value during the given counting interval, and switching off the electric tool when the reading of the counter is higher than a specified limit value for the counter.

Accordingly, the electric tool can already be switched off when at least one reading of the counter has exceeded the associated specified limit value for the counter.

In another embodiment, the reading of the counter is decremented by at least twice the specified decrement whenever the measured current is lower than a specified lower limit value during the given counting interval.

In another embodiment, the reading of the counter is decremented by twice the specified decrement whenever the measured current is lower than the lower limit value and is higher than zero during the given counting interval, and the reading of the counter is decremented by three times the specified decrement whenever the measured current is zero during the given counting interval.

The lower limit value can correspond to the upper limit value. However, the lower limit value can also lie between the upper limit value and zero.

In another embodiment, the counting interval is between 0.25 ms and 50 ms. The battery can also be referred to as a rechargeable battery, a secondary battery or an accumulator. The battery especially has several rechargeable battery cells, for example, lithium-ion accumulator cells.

In another embodiment, the upper limit value is determined as a function of the C factor of the battery. The C factor of the battery results from the ratio of current to capacity.

Moreover, a device for monitoring the current of a battery-operated electric tool is being put forward. The current-monitoring device has a measuring means, at least one counter, and a contact-breaking means. The measuring means is configured to measure the electric current drawn from the battery during the operation of the electric tool. The at least one counter is configured to increment its reading by a certain increment whenever the measured current is higher than a specified upper limit value during a given counting interval, and to decrement the reading by a certain decrement whenever the measured current is lower than the specified upper limit value during the given counting interval. The contact-breaking means switches off the electric tool when the reading of the counter is higher than a specified limit value for the counter.

In one embodiment, several counters are provided. A certain increment, a certain decrement, a certain counting interval, a certain upper limit value and a certain limit value for the counter are each associated with the appertaining counter. The contact-breaking means switches off the electric tool when at least one reading of the counter is higher than its specified limit value for the counter.

In another embodiment, the counter is configured to decrement its reading by at least twice the specified decrement whenever the measured current is lower than a specified lower limit value during the given counting interval.

In another embodiment, the counter is configured to decrement its reading by twice the specified decrement whenever the measured current is lower than the lower limit value and is higher than zero during the given counting interval, and to decrement its reading by three times the specified decrement whenever the measured current is zero during the given counting interval.

Moreover, a control unit is being put forward for controlling a battery-operated electric tool, said control unit having a device as described above for monitoring the current of the electric tool.

The control unit is configured, for example, as part of the electronic system of the electric tool. For instance, the control unit is a microcontroller.

Moreover, an electric tool with a battery is being put forward which has a device according to the invention as described above for monitoring the current of the electric tool.

The electric tool is, for example, a handheld power tool. The handheld power tool is especially an electric handheld power tool such as, for instance, an electric screwdriver.

The electric screwdriver has a housing with a handle by means of which a user can hold and guide the electric screwdriver. A pushbutton on the handle allows the user to turn on the electric screwdriver. For instance, the user has to continuously hold the pushbutton depressed in order to keep the electric screwdriver in operation.

The electric screwdriver has a tool socket into which the user can insert, for example, a screwdriver bit. When the pushbutton is actuated, an electric motor turns the tool socket around its axis. The electric motor is coupled to the tool socket via a spindle and optionally by other components of a drive train, e.g. clutch, gears.

BRIEF DESCRIPTION OF THE DRAWINGS

The description below explains the invention on the basis of embodiments and figures provided by way of examples. The figures show the following.

Unless otherwise indicated, the same or functionally identical elements are designated by the same reference numerals in the figures.

DETAILED DESCRIPTION

Figure 1:
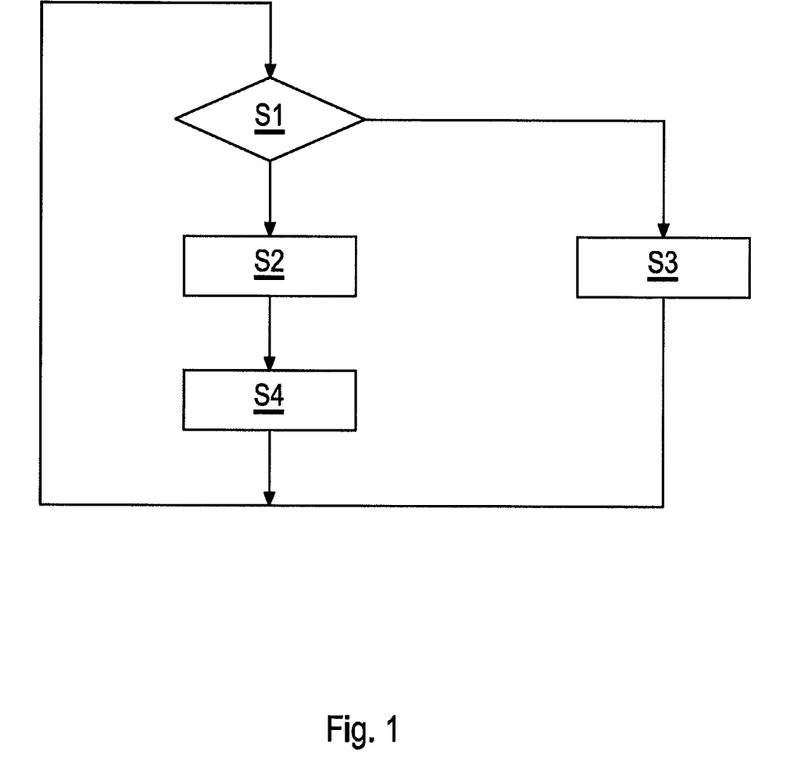
FIG. 1: a schematic flow chart of a method to monitor the current of a battery-operated electric tool.

FIG. 1 shows a schematic flow chart of a method to monitor the current of an electric tool 3 operated by a battery 2.

In step S1, the electric current I drawn from the battery 2 during the operation of the electric tool 3 is measured. In particular, a discrete value of the electric current I is indicated during every counting interval.

Step S2 is carried out whenever the discrete value of the measured current I is higher than a specified upper limit value G1, G2 during the given counting interval. However, step S3 is carried out if the discrete value of the measured current I is lower than the specified upper limit value G1, G2 during the given counting interval. In step S2, the reading Z of the counter 5 is incremented by a certain increment IN. For example, the counter 5 is incremented by a value of 1.

In step S3, the reading Z of the counter 5 is decremented by a certain decrement DE if, as explained above, the discrete value for the measured current I is lower than the specified upper limit value G1, G2 during the given counting interval. Accordingly, as a function of the current I measured in each case, the determination is made in each counting interval as to whether the reading Z of the counter 5 is incremented (step S2) or decremented (step S3).

In step S4, the electric tool 3 is switched off if the reading Z of the counter 5 is higher than a specified limit value T1, T2 for the counter. In other words, the electric tool 3 is switched off every time the reading Z of the counter exceeds the specified limit value T1, T2 for the counter.

Figure 4:
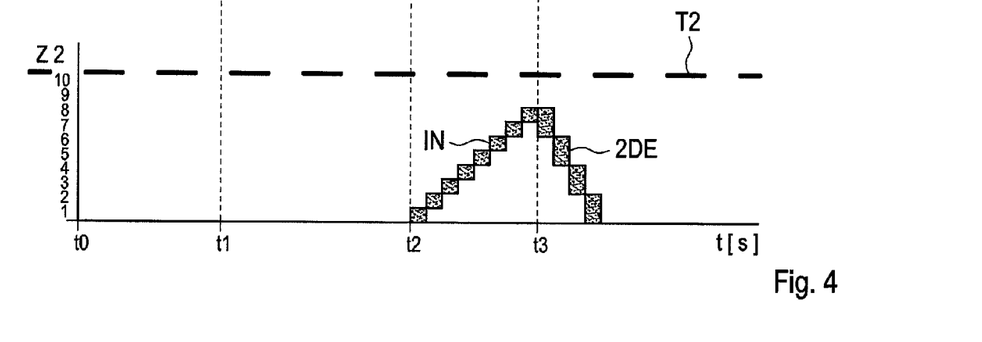
FIG. 4: a diagram that depicts a second counter for the current curve of FIG. 2.

Altogether, the steps S1 to S4 of FIG. 4 are carried out in each counting interval. The counting interval is, for instance, between 0.25 ms and 50 ms. The upper limit value G1, G2 is determined especially as a function of the C factor of the battery 2.

Instead of using a single counter 5, one can also use several counters 5. The different counters 5 can be employed with different increments IN, different decrements DE, different specified counting intervals, different specified upper limit values G1, G2 and different specified limit values T1, T2 for the counter.

Moreover, it is also possible that, in step S3, the reading Z of the counter 5 is decremented by at least twice the specified decrement DE whenever the measured current I is lower than a specified lower limit value during the given counting interval. For example, the lower limit value can also correspond to the upper limit value G1, G2. Furthermore, here it is also possible to decrement the reading of the counter 5 by at least twice (2DE) the specified decrement DE whenever the measured current I is lower than the lower limit value and is higher than zero during the given counting interval. However, if the measured current I is zero during the given counting interval, then the reading Z of the counter 5 can be decremented by three times the specified decrement DE.

Figure 2:
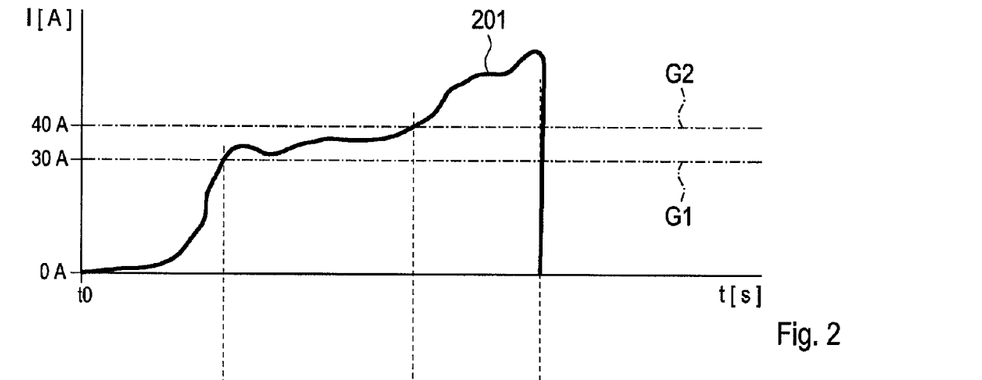
FIG. 2: an I-t diagram that depicts a first example of a current curve.
Figure 3:
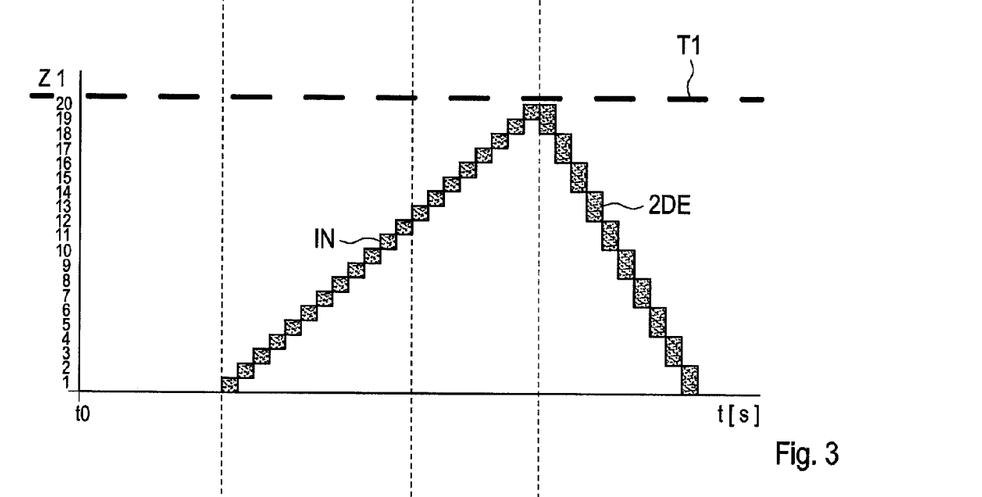
FIG. 3: a diagram that depicts a first counter for the current curve of FIG. 2.

For purposes of further elucidating the method being presented in FIG. 1, FIGS. 2 to 4 show a first example for a current curve 201. In this context, FIG. 2 shows an I-t diagram that depicts the first example of the current curve 201. Moreover, FIG. 3 shows a diagram that depicts a first counter Z1 for the current curve 201 of FIG. 2. Furthermore, FIG. 4 shows a diagram that depicts a second counter Z2 for the current curve 201 of FIG. 2. The x axes of FIGS. 2 to 4 each show the time t in seconds. The y axis of FIG. 2 depicts the current I in amperes. The y-axis of FIG. 3 depicts the reading Z1 of the first counter 5. Accordingly, the y-axis of FIG. 4 depicts the reading Z2 of the second counter 5.

For the first counter 5 according to FIG. 3, a first upper limit value G1 is 30 A for the current I (see FIG. 2) and a limit value T1 for the counter is 20 (see FIG. 3). For the second counter 5 according to FIG. 4, a second upper limit value G2 is 40 A for the current I and a limit value T2 for the counter is 10.

At the point in time t1, the current curve 201 exceeds the limit value G1. This is when the first counter 5 starts to count up as of the point in time t1. In each counting interval, the counter 5 increments its reading Z1 by the associated specified increment IN, for instance, by a value of 1.

At the point in time t2, the current curve 201 exceeds 40 A and thus the second limit value G2. Consequently, the second counter 5 starts to increment its reading Z2 as of the point in time t2. Altogether, the two counters 5 of FIGS. 3 and 4 increment their readings Z1, Z2 as of the point in time t2.

At the point in time t3, as shown in FIG. 3, the first reading Z1 of the counter reaches its specified upper limit value G1 of 20.

Consequently, the electric tool 3 is switched off at the point in time t3 since Z1=T1. As of the point in time t3, the measured current I is zero. Consequently, the readings Z1 and Z2 of the two counters 5 of FIGS. 3 and 4 are decremented by the appertaining decrement DE. For example, the decrement DE in each case is 2 and thus twice as much as the increment IN.

Figure 5:
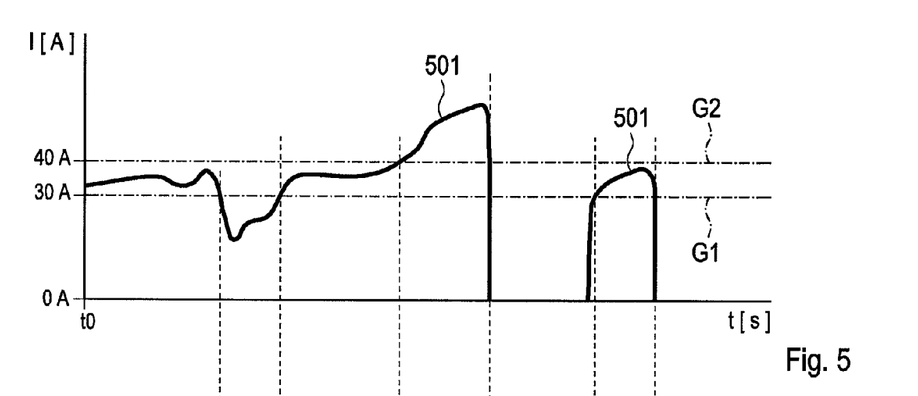
FIG. 5: an I-t diagram that depicts a second example of a current curve.

Another example of a curve 501 for a current I is depicted in FIG. 5. Analogously to FIGS. 3 and 4, FIGS. 6 and 7 depict a first counter 5 having a first reading Z1 (FIG. 6) and a second counter 5 having a reading Z2.

Figure 6:
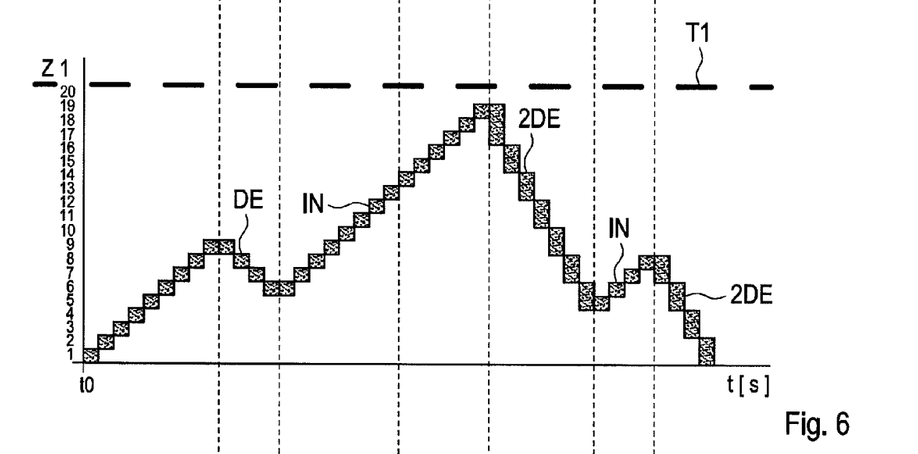
FIG. 6: a diagram that depicts a first counter for the current curve of FIG. 5.
Figure 7:
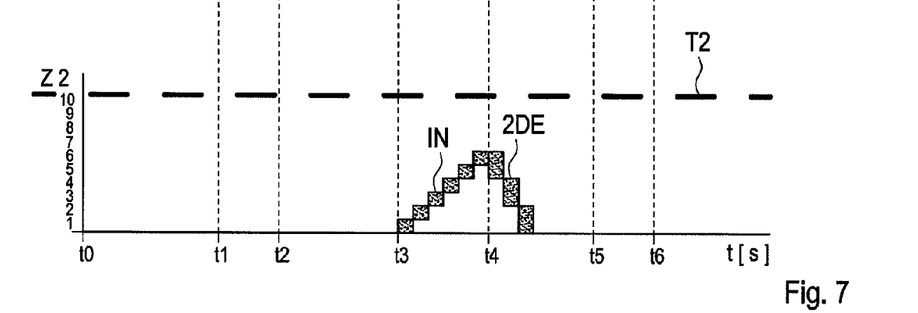
FIG. 7: a diagram that depicts a second counter for the current curve of FIG. 5.

At the point in time t0, the current I according to the current curve 501 is higher than 30 A and lower than 40 A. Consequently, as shown in FIG. 6, the first counter 5 increments its reading Z1 as of the point in time t0. The second counter 5 of FIG. 7 does not increment its reading Z2 since the current I according to the current curve 501 is lower than the second limit value G2 of 40 A.

At the point in time t2, the current I falls below 30 A, as shown in the current curve 501. Consequently, the first counter 5 of FIG. 6 decrements the reading Z1 as of the point in time t1 by a decrement DE.

As of the point in time t2, as shown in the current curve 501, the current I is once again higher than 30 A and thus higher than the first limit value G1. Consequently, the first counter 5 of FIG. 6 once again increments its reading Z1 as of the point in time t2.

At the point in time t3, as shown in the current curve 501, the current I also exceeds the second limit value G2. Consequently, the second counter 5 of FIG. 7 also counts up as of the point in time t3. In this process, its reading Z2 of the counter is incremented by the increment IN during each counting interval.

At the point in time t4, the electric tool 3 is switched off by the user. Even though at the point in time t4 the first reading Z1 of the counter of FIG. 6 has not reached its limit value T1 and has the second reading Z2 of the counter of FIG. 7 not reached its limit value T2 either, both counters 5 decrement their readings Z1, Z2 by the double decrement 2DE. As of the point in time t4, the double decrement 2DE is employed for decrementing since the current I as shown in the current curve 501 is zero.

At the point in time t5, the current I as shown in the current curve 501 once again exceeds 30 A. Consequently, the first counter 5 of FIG. 6 once again counts up. At the point in time t6, the user switches off the electric tool again. so that the first reading Z1 of the counter of FIG. 6 is once again decremented by the double decrement 2DE.

Figure 8:
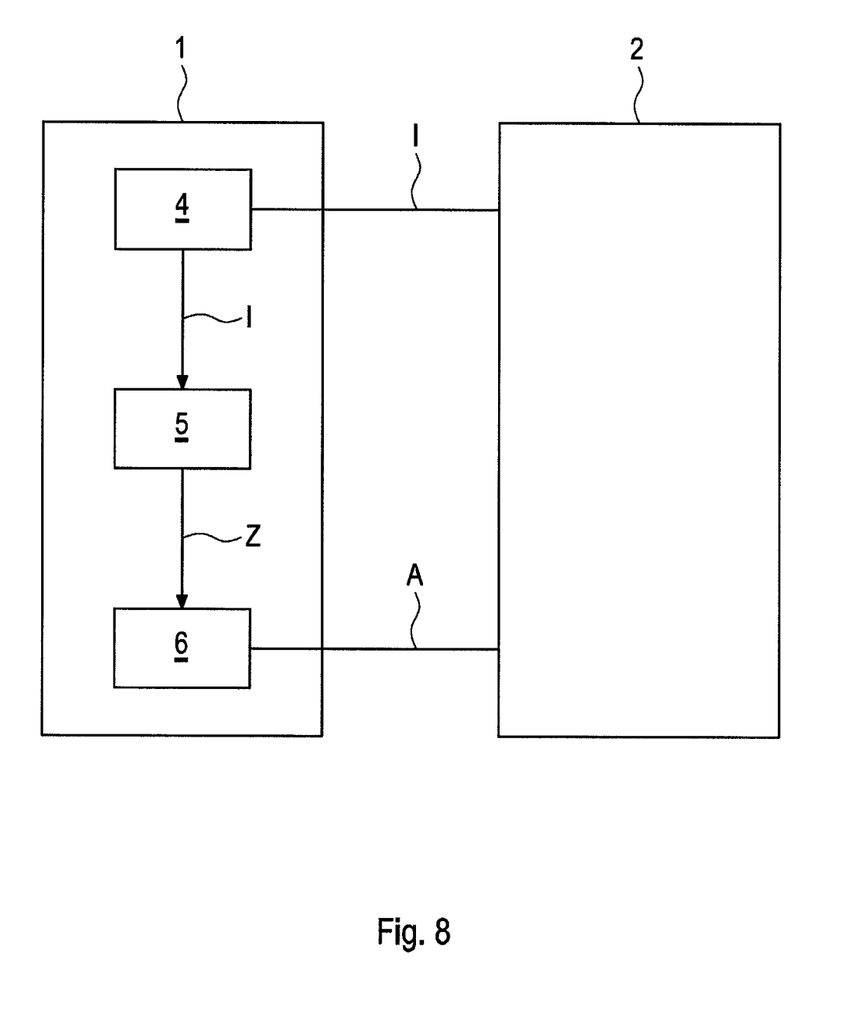
FIG. 8: a schematic block diagram of a first embodiment of a device to monitor the current of a battery-operated electric tool.

FIG. 8 shows a schematic block diagram of a first embodiment of a device 1 to monitor the current of an electric tool 3 operated by a battery 2. The device 1 has a measuring means 4, a counter 5 coupled to the measuring means 4, and a contact-breaking means 6 coupled to the counter 5. The measuring means 4 measures the electric current I that is drawn from the battery 2 during the operation of the electric tool 3. Moreover, the measuring means 4 indicates the measured current I to the counter 5 during each counting interval. In this process, the measured current I is indicated, for example, as a discrete value. The counter 5 increments its reading Z by a given increment IN whenever the measured current I is higher than a specified upper limit value G1, G2 during the given counting interval. Moreover the counter 5 decrements its reading Z by a given decrement DE whenever the measured current I is lower than the specified upper limit value G1, G2 during the given counting interval.

The counter 5 indicates its reading Z to the contact-breaking means 6. If the reading Z of the counter 5 is higher than a specified limit value G1, G2 for the counter, the contact-breaking means 6 switches off the electric tool 3. For instance, the contact-breaking means 6 interrupts the current feed from the battery 2 to the electric tool 3. For this purpose, the contact-breaking means 6 uses, for example, a switch-off signal A.

Figure 9:
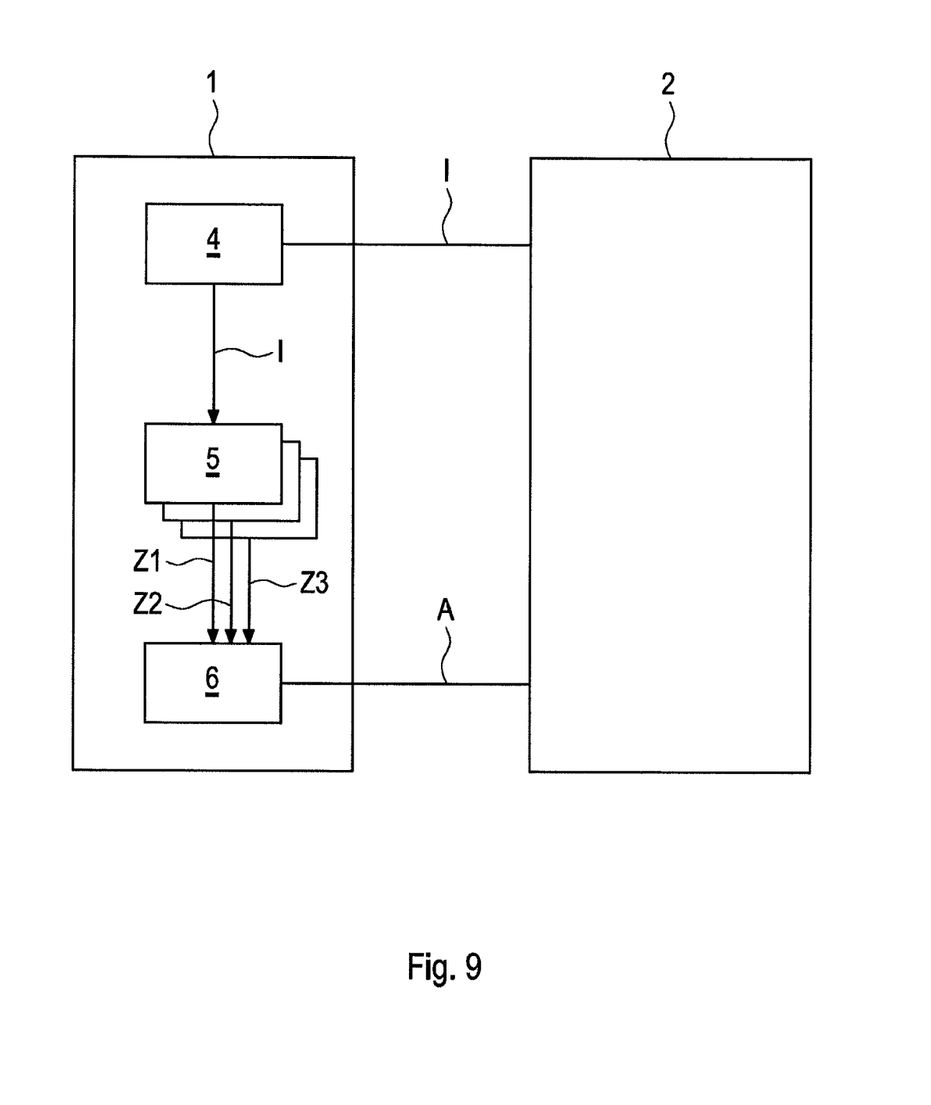
FIG. 9: a schematic block diagram of a second embodiment of a device to monitor the current of a battery-operated electric tool.

FIG. 9 shows a schematic block diagram of a second embodiment of a device 1 to monitor the current of an electric tool 3 operated by a battery 2.

The second embodiment of FIG. 9 differs from the first embodiment of FIG. 8 in that several counters 5 are provided. Without constituting a restriction of the general validity. FIG. 9 shows three counters 5 that each indicate a reading Z1, Z2, Z3 on the output side. If one of these readings Z1, Z2, Z3 of the counter exceeds an associated limit value for the counter, then the contact-breaking means 6 switches off the electric tool 3.

Figure 10:
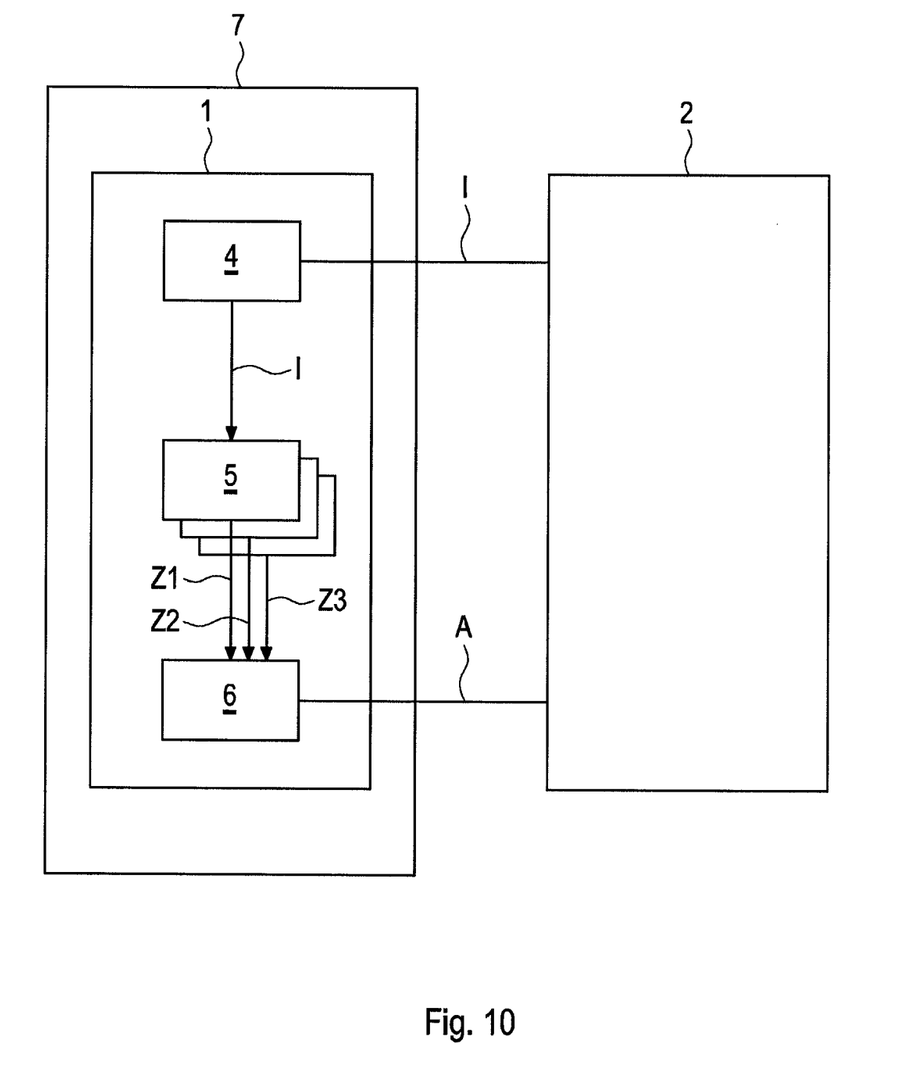
FIG. 10: a schematic block diagram of an embodiment of a control unit of an electric tool.

FIG. 10 shows a schematic block diagram of an embodiment of a control unit 7 of an electric tool 3. The control unit 7 has the device 1 of FIG. 9. As an alternative, the control unit 7 can have the device 1 of FIG. 8.

Figure 11:
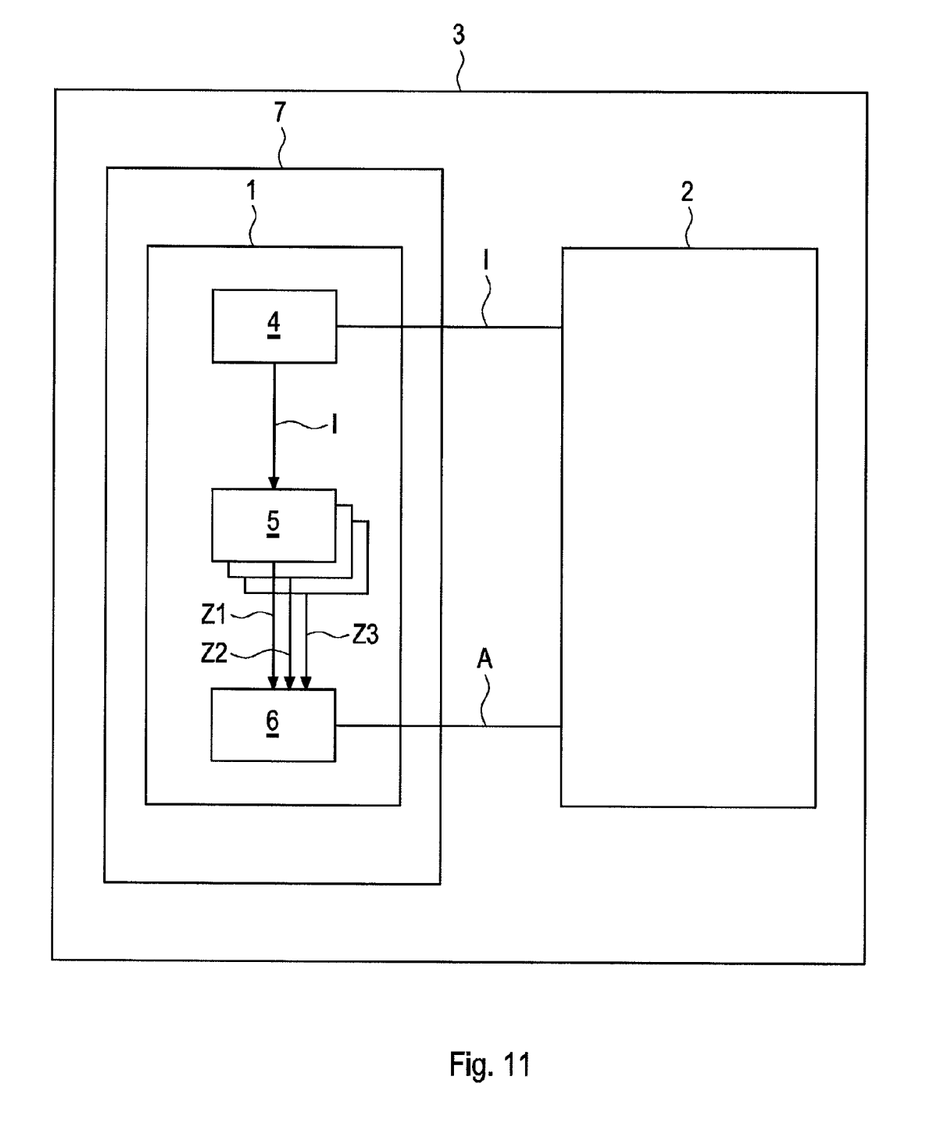
FIG. 11: a schematic block diagram of an embodiment of an electric tool.

FIG. 11 shows a schematic block diagram of an embodiment of an electric tool 3. The electric tool 3 has the control unit 7 of FIG. 10. The electric tool 3 is, for example, a handheld power tool, for instance, an electric screwdriver, power drill, hammer drill, angle grinder, battery-operated handheld circular saw. Moreover, the device 1 can also be integrated into the battery 2 of the handheld power tool.

What is claimed is:

1. A method to monitor the current of a handheld power tool operated by a battery, via at least one counter, comprising the following steps:
   a) measuring the electric current drawn from the battery during operation of the electric tool;
   b) incrementing a reading of the counter by a certain increment whenever the measured current is higher than a specified upper limit value during a given counting interval;
   c) decrementing the reading of the counter by a certain decrement whenever the measured current is lower than the specified upper limit value during the given counting interval; and
   d) switching off the electric tool when the reading of the counter is higher than a specified limit value for the counter.

2. The method as recited in claim 1 wherein the at least one counter includes several counters, whereby the certain increment, the certain decrement, the certain counting interval, the certain upper limit value and the certain limit value are associated with the appertaining counter.

3. The method as recited in claim 2 wherein the steps b) to d) are carried out for each counter of the plurality of counters.

4. The method as recited in claim 1 wherein the reading of the counter is decremented by at least twice the specified decrement whenever the measured current is lower than a specified lower limit value during the given counting interval.

5. The method as recited in claim 4 wherein the reading of the counter is decremented by twice the specified decrement whenever the measured current is lower than the lower limit value and is higher than zero during the given counting interval, and the reading of the counter is decremented by three times the specified decrement whenever the measured current is zero during the given counting interval.

6. The method as recited in claim 1 wherein the counting interval is between 0.25 ms and 50 ms.

7. The method as recited in claim 1 wherein the upper limit value is determined as a function of the C factor of the battery.

8. A device for monitoring the current of an electric tool operated by a battery, comprising the following:
   a measurer to measure the electric current drawn from the battery during the operation of the electric tool;
   at least one counter configured to increment its reading by a certain increment whenever the measured current is higher than a specified upper limit value during a given counting interval, and to decrement the reading by a certain decrement whenever the measured current is lower than the specified upper limit value during the given counting interval; and
   a contact-breaker to switch off the electric tool when the reading of the counter is higher than a specified limit value for the counter.

9. The device as recited in claim 8 wherein the at least one counter includes several counters, whereby the certain increment, the certain decrement, the certain counting interval, the certain upper limit value and the certain limit value are each associated with the appertaining counter, the contact-breaker switching off the electric tool when at least one reading of the counter is higher than its specified limit value for the counter.

10. The device as recited in claim 8 wherein the counter is configured to decrement the reading by at least twice the specified decrement whenever the measured current is lower than a specified lower limit value during the given counting interval.

11. The device as recited in claim 10 wherein the counter is configured to decrement the reading by twice the specified decrement whenever the measured current is lower than the lower limit value and is higher than zero during the given counting interval, and to decrement the reading by three times the specified decrement whenever the measured current is zero during the given counting interval.

12. The device as recited in claim 8 wherein the counting interval is between 0.25 ms and 50 ms.

13. The device as recited in claim 8 wherein the upper limit value is determined as a function of the C factor of the battery.

14. A control unit for controlling an electric tool operated by a battery, the control unit comprising: the device as recited in claim 8.

15. A handheld power tool comprising the device as recited in claim 8.

* * * * *